(12) United States Patent
Chen et al.

(10) Patent No.: US 6,922,800 B2
(45) Date of Patent: *Jul. 26, 2005

(54) TEST SEQUENCES GENERATED BY AUTOMATIC TEST PATTERN GENERATION AND APPLICABLE TO CIRCUITS WITH EMBEDDED MULTI-PORT RAMS

(75) Inventors: Xinghao Chen, Endwell, NY (US); Joseph C. Watkins, Endicott, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/654,626

(22) Filed: Sep. 3, 2003

(65) Prior Publication Data

US 2004/0128406 A1 Jul. 1, 2004

Related U.S. Application Data

(63) Continuation of application No. 09/697,362, filed on Oct. 26, 2000, now Pat. No. 6,618,826.

(51) Int. Cl.[7] .............................................. G11C 29/00

(52) U.S. Cl. ...................................... 714/718; 365/201

(58) Field of Search ................................. 714/718, 719, 714/720; 365/200, 201

(56) References Cited

U.S. PATENT DOCUMENTS 3,961,250 A * 6/1976 Snethen ...................... 714/718

OTHER PUBLICATIONS

NN86081209, Prevention of Unknown States (Indeterminate Data) in Multi-Port Arrays During Random Pattern, IBM Technical Disclosure Bulletin, Aug. 1986, vol. 29, Issue No. 3, pp. 1209-1210.*

Ismaeel, A.A.; Testing for stuck faults in CMOS combinational circuits, IEE Proceedings G Circuits, Devices and Systems, vol.: 138 Issue: 2, Apr. 1991, pp.: 191-197.*

Hideo Fujiwara and Takeshi Shimono; On the Acceleration of Test Generation Algorithms, IEEE Transactions on Computers, vol. C-32, No. 12, Dec. 1983, pp.:1137-1144.

Prabhakar Goel and Barry C. Rosales; PODEM-X: An Automatic Test Generation System For VLSI Logic Structures, 18th Design Automation Conference, Paper 13.3, 1981 IEEE, pp. 260-268.

Prabhakar Goel; An Implicit Enumeration Algorithm to Generate Tests for Combinational Logic Circuits, IEEE Transactions on Computers, vol. C-30, No. 3, Mar. 1981, pp. 215-222.

* cited by examiner

Primary Examiner—Joseph D. Torres
(74) Attorney, Agent, or Firm—Orrick Herrington & Sutcliffe, LLP

(57) ABSTRACT

A method for improving the efficiency of test sequences for circuits with embedded multiple-port arrays, such as random access memory (RAM), is described, With existing test generation methods, it is a common occurrence that a resulting test sequence only utilizes a minimum number of read ports for detecting a target fault. When this type of test sequences is applied, one or more outputs of embedded RAMs may not attain known values, consequently reducing the effectiveness of the test sequences. The present invention enhances test sequences to that when they are applied, all outputs of embedded RAMs attain known values.

9 Claims, 6 Drawing Sheets

Port 4: Same as Port 3, except A3 is at 0 and A4 at 1
Port 5: Same as Port 3, except A3 is at 0 and A4 at 0

TEST SEQUENCES GENERATED BY AUTOMATIC TEST PATTERN GENERATION AND APPLICABLE TO CIRCUITS WITH EMBEDDED MULTI-PORT RAMS

This is a continuation application Ser. No. 09/697,362, filed Oct. 26, 2000, now U.S. Pat. No. 6,618,826.

TECHNICAL FIELD

This invention is related to testing integrated circuit, and more particularly to a method for improving the efficiency of test sequences intended for testing circuits having a plurality of multi-port RAMs embedded in logic.

BACKGROUND OF THE INVENTION

In the last few decades there has been a drastic development in the field of microelectronic, particularly in the field of integrated circuits. Circuit density in the order of hundreds of millions of interconnected circuits has prompted the introduction of new techniques for automatically designing and testing the integrated circuits. In today's environment, with the advent of VLSI (Very Large Scale Integration) and ULSI (Ultra Large Scale Integration) it is imperative more than ever that a chip to be manufactured be designed without any error. It is just as important that such chips be tested thoroughly and easily to weed out any defective chip.

Techniques for testing integrated circuits have evolved over the years, and the impact of testing on the chip design has grown in importance. It is no longer possible to design an integrated circuit chip without due consideration of its testing aspect. This approach is known as Design for Testability.

A difficult problem encountered while making a chip ever more testable is a trend in industry to merge logic and memories onto a single chip. The problem is further complicated by the logic surrounding the memory from all sides; hence, its name embedded memory or array. Techniques had to be developed to account for this trend, which prompted the introduction of scan designs, well known in the art. By placing scan chains at the boundaries between the logic and the embedded arrays, it is possible to segregate the logic from the memory in order that they be tested separately.

Memories have evolved over the years from stand-alone to embedded and from single port to multi-port arrays. A typical architecture of a circuit with an embedded multi-port memory is illustrated in FIG. 1.

A multi-port RAM embedded in logic (40) is typically provided with multiple write/reset ports and multiple read ports, each capable of accessing either a section or the entire storage space of the RAM. A simple conventional RAM is provided with a write port formed by a plurality of address pins (Ao, ..., Aj), a plurality of data pins (Do, ..., Di) equal to the word length, and a write clock pin (W_clk), serving as inputs. A bank of setup latches (30) controls the address and input data pins of the embedded RAM through combinatorial logic blocks (25). A pulse on the write clock pin (W_clk) of the RAM stores data on the input data pins (Do, ..., Di) at a word location specified by the address pins (Ao, ..., Aj). (For sake of simplicity, timing-related issues such as hold time unless specifically pointed out will be ignored). A read port, on the other hand, includes a plurality of address pins (Ao, ..., Aj) and a read-enable pin (R_en) as its inputs, and a number of data output pins (Do, ..., Di) equal to the word length. When a read port is read-enabled, the bit values of the word selected by the address on the read port address pins become available at the output data pins and are latched in read-capture latches (10) by a subsequent pulse on the read-capture clock. When the read port is read-disabled, the output pins take a so-called read-off value which depends on the physical design of the RAM for a specific technology. The read-off value is either a logic 0, 1, or X (i.e., a condition wherein neither a logic 1 nor a 0 is guaranteed).

Still referring to FIG. 1, logic (40) is provided with a plurality of input pins (Plo, ..., Plp) and clock signal pins (CLKo, ..., CLKk) as primary inputs, and plural output pins (POo, ..., POq) as primary outputs. The clock distribution and gating logic (15) prompt clocks (CLKo, ..., CLKk) and a subset of the inputs (Plo, ..., Plp) to generate control signals to activate the setup latches (30), the write clock pins (W—clk) of the RAM's write ports, the read-capture signals to the read-capture latches (12) and local clocks regulating the sequential elements (20).

Oftentimes, combinatorial logic as well as sequential elements (20) are present in the 'upstream' and 'downstream' logic from the embedded RAM. Circuits using multiple clocks (e.g., CLKo, ..., CLKk) are provided with a clock distribution and gating logic (15) that includes sequential elements as well. Other circuits, having combinatorial logic blocks (25), are positioned between the setup latches (30), the embedded multi-port RAM and the read-capture latches (12).

In a full scan design, as illustrated in FIG. 2, an embedded RAM is directly controlled by the setup latches (30, in FIG. 1) and read-capture latches (12, in FIG. 1) which are configured as scan latches (50). Typically, they are linked to form a chain (or chains) for scan shift (load and unload) operations. The scan-load operation sets the scan latches to the desired values and the scan-unload shifts out the values stored in the latches.

In a partial-scan design, as illustrated in FIG. 3, the setup latches (30, In FIG. 1) are configured as scan latches (50) directly controlling the data and address inputs of the RAM, except for the read-capture latches (12, in FIG. 1). In a non-scan design, all the latches and memory elements are configured in a non-scannable configuration and are not directly accessible through the primary inputs and outputs.

A write/read port must have as its inputs a plurality of address pins, a plurality of data input pins equal to the word length, a write clock pin and a read enable pin, and a plurality of data output pins equal to the word length as its outputs.

A write/read port combines the functions of a write port with those of a read port, using a single set of address input pins. When a pulse appears at the write clock pin while the port is read-enabled, data on the data input pins becomes available at the output pins during and after the write clock pulse, provided that the port is still read-enabled while the address inputs remain unchanged. Such an operation is commonly referred to as write-through mode. It can also be advantageously configured having separate write and read ports.

A reset port has as inputs a plurality of data input pins equal to the word length and a write clock pin. During and following a pulse being applied to the write clock pin of a reset port, data on the input pins is written into all words in the RAM. When more than one write/reset port attempts to simultaneously write on the same word, it is customary that the design and technology dictate that one of the ports dominate the write operation. Accordingly, the bits that prompt the two simultaneous write operations attempting to write different values are set in a predetermined manner. In the present model, the dominant port always appears before the dominated port(s). When such specification is not available from the designer and/or technology sources, unknown values are assumed for the bits having conflicting values on simultaneous writes. A RAM provided with a read-capture built-in capability holds the read data available at the output pins until the next read operation is performed. Such a RAM configuration is commonly referred to as read-hold.

Deterministic Test Pattern Generation

Referring now to the test circuits that include (an) embedded RAM(s), it is known in the art that in a conventional deterministic automatic test pattern generation (ATPG), a target fault is selected for processing in the upstream or downstream logic from the embedded RAM, including at the input and output pins of the RAM. A test sequence is then generated if the target fault is testable. This test sequence is transferred to another process, referred to as test subsumation, which identifies similar test sequences and merges them into one. Test sequences resulting from the subsumation process are significantly more compact, with unspecified input pins filled with random values, and are sent to the fault simulation process for simulation against undetected faults.

Deterministic ATPG process typically employs one or more deterministic test generation algorithms such as PODEM described e.g., by P. Goel, "PODEM-X: An automatic test generation system for VLSI logic structures", published in the Proceedings of the 18th Design Automation Conference, pp. 260–268, 1981, and "An implicit enumeration algorithm to generate tests for combinatorial logic circuits", IEEE Trans. Computers, C-30 (3): 215–222, 1981. A second ATPG algorithm referred to as FAN is described by H. Fujiwara and T. Shimono, "On the acceleration of test generation algorithms", IEEE Transactions of Computers, C-32 (12): 1137–1144, 1983, and in a textbook by H. Fujiwara, "Logic testing and design for testability", MIT Press, 1985.

Deterministic ATPG algorithms generally include three distinct process components: fault excitation, path sensitization, and state or logic justification. The distinguishing characteristic of each ATPG algorithm resides in how the execution of these three tasks differs in the order of processing to maximize the efficiency of the algorithm.

A typical deterministic test sequence exercises only selected read ports that are required for testing the target fault. Therefore, when the test sequence is applied, read ports having a predetermined data at their output pins (or at some other read ports) are set to read from words that were already written with a specific or desired data. It results that non-utilized read ports generate an X value at the respective outputs, reducing the efficiency of the test sequences.

By way of example, and with reference to FIG. 4, there is shown an embedded RAM consisting of one WRITE port and four READ ports, wherein R_en (Reset enable) pins of the read ports and the last two read address pins of each read port are "hard wired". The intent is to generate a deterministic test sequence which detects a stuck-at-0 fault condition, e.g., at the d0 output line of Port 2. A typical deterministic test generation algorithm (such as PODEM or FAN) initiates the test pattern generation process by setting a fault excitation value of 1 on the same d0 output line where the target fault is located. The algorithm backtraces (i.e., traverses in the direction from an output towards an input) through the RAMs Port 2, knowing that the port is a READ port and its R_en pin is ON (since it is attached to a 1). A read address is then selected, assuming all 1s on the A0-2 pins of Port 2. These assumed 1s at the A0-2 pins of Port 2 are justified by loading the setup scan latches, which directly set the pins to 1. Next, in order to ensure that the Port 2 D0 output data pin is at 1 (to distinguish the fault condition of stuck-at-0), it requires a write operation to set the data bit D0 of the RAM to 1 at selected all-1 word address pins. These write address and data pins are set by loading 1s on the setup scan latches that directly control the A0-4 address pins. The same is done for the D0 data pin of Port 1. Once the setup scan latches are loaded with the desired address and data values, a PULSE on the write clock controlling the W_-clk pin of Port 1 writes a data 1 into data bit D0 at the selected word (A0-4=11111) producing a 1 at the output pin D0 of Port 2 in the fault-free circuit. Now the fault-free circuit has a 1 on the data output pin D0 of Port 2, while the same output pin has the stuck-at-0 condition in the faulty-circuit. Therefore, the fault-effect 1/0 (for fault-free-value/faulty-value) appears at the input of the read-capture latch, whose data input is fed by the D0 output pin of Port 2. A pulse on this read-capture latch captures the fault-effect 1/0 into its memory. A subsequent scan shift operation shifts the fault-effect out for observation.

The resulting test sequence of prior art, referred to as Test Sequence 1, is described as follows with reference to the waveforms illustrated in FIG. 5:

Test Sequence 1:
  Pattern 1: (Type=Scan-Load)
    Load the setup latches such that A0-4 and D0 of Port 1, and A0-2 of Port 2 are all at 1
  Pattern 2: (Type=Pulse Clock)
    Apply a PULSE to the write clock.
  Pattern 3: (Type=Pulse Clock)
    Apply a PULSE to the read/capture clock.
  Pattern 4: (Scan-Unload)
    Shift out the data captured in the Read-Capture latches When the Test Sequence 1 is applied, it generates a miscompare (i.e., the fault-free circuit signal value is different from the faulty circuit signal value) on data bit D0 of Port 2 located in the scan shift-out data stream. Pattern 1 is a test data input pattern of scan-load type which loads the setup latches controlling the A0-4 address and D0 data pins of Port 1, along with those controlling A0-2 address pins of Port 2, setting them all to 1. After applying this pattern, the circuit is conditioned as shown in FIG. 4, into a write-ready state with the RAM write operation singled out by a write clock.

Pattern 2 is a test data input pattern of a pulse clock type which specifies applying a pulse to the write clock input. After applying Pattern 2, data bit D0 at the word address 11111 is set to 1. The remaining data bits at the same address are assigned random values since the scan load by Pattern 1 did not set up the scan latches controlling the D1-3 pins of Port 1 with specified input values. After applying Pattern 2, a fault-effect 1/0 appears on the data output pin 0 of Port 2 as well as on line d0.

Pattern 3 is a test data input of pulse clock type which locks the fault-effect 1/0 into the associated latch in the bank of read-capture latches's shown in FIG. 4. After applying Pattern 3, the fault-effect 1/0 is locked by the read-capture scan latch which data input is directly fed by the D0 output pin of Port 2.

Pattern 4 is a test data input of scan unload, which instructs shifting out the scan latch contents. After applying Pattern 4, the 1/0 fault-effect from the data output pin D0 of Port 2 is observed in the scan-out data stream.

Note that lines A0-2 of Port 1 and Port 2 can be set with any combination of 0s and 1s, provided that the read and write addresses are identically set up in Pattern 1.

FIG. 5 shows the waveforms applicable to the circuit shown in FIG. 4 when Test Sequence 1 is applied. The vertical lines referenced by A, B, C, D and E at the near-bottom of FIG. 5 denote the specific time of each signal transition. Vertical line A indicates the moment immediately after applying Pattern 1, with the A0-4 address and D0 pins of Port 1, along with the A0-2 address pins of Port 2 set to the desired values. Vertical line B indicates the instant when Pattern 2 is applied. Data output D0 pin of Port 2 in the fault-free circuit is set to 1. The signal waveform on the same D0 output pin of Port 2 of a defective circuit is not shown in FIG. 5, since it remains permanently at 0 to reflect a stuck-at-0 fault condition. Vertical lines C and D indicate the beginning and the end of the read-capture clock pulse, respectively, when Pattern 3 is applied, which locks the 1/0 fault-effect into the associated read-capture scan latch. Vertical line E indicates the instant when Pattern 4 is applied, which scans-out the scan latch data. The 1/0 fault effect is observed in the scan-out data stream.

Similarly, conventional deterministic ATPG algorithms generate the following Test Sequences 2, 3, and 4 for stuck-at-0 faults on the d0 output lines of Ports 3, 4, and 5, respectively:

Test Sequence 2:
 Pattern 1: (Type=Scan Load)
  Load the Setup latches so that A0-3 and D0 of Port 1 are at 1, A4 is at 0, and A0-2 of Port 3 are at 1.
 Pattern 2: (Type=Pulse Clock)
  Apply a PULSE to the write clock.
 Pattern 3: (Type=Pulse Clock)
  Apply a PULSE to the read/capture clock.
 Pattern 4: (Type=Scan Unload)
  Shift out the data captured in the Read-Capture latches.
Test Sequence 3:
 Pattern 1: (Type=Scan Load)
  Load the Setup latches so that A0-2, A4 and D0 of Port 1 are at 1, A3 is at 0, and A0-2 of Port 4 is at 1.
 Pattern 2: (Type=Pulse Clock)
  Apply a PULSE to the write clock.
 Pattern 3: (Type=Pulse Clock)
  Apply a PULSE to the read/capture clock.
 Pattern 4: (Type=Scan Unload)
  Shift out the data captured in the Read-Capture latches
Test Sequence 4:
 Pattern 1: (Type=Scan Load)
  Load the Setup latches so that A0-2 and D0 of Port 1 are at 1, A3-4 are at 0, and A0-2 of Port 5 are at 1.
 Pattern 2: (Type=Pulse Clock)
  Apply a PULSE to the write clock.
 Pattern 3: (Type=Pulse Clock)
  Apply a PULSE to the read/capture clock.
 Pattern 4: (Type=Scan Unload)
  Scan-out the data captured in the read-capture latches Test Sequences 1, 2, 3, and 4 can be applied in any order to form a test set of 16 test patterns. These four test sequences share the same pattern flow, namely: scan load (Pattern 1)->Pulse clock (Pattern 2)->Pulse clock (Pattern 3)->scan unload (Pattern 4). Among the many characteristics commonly known to practitioners generating deterministic test patterns, there are two distinct concerns associated with those deterministically generated test sequences for circuits having embedded multi-port RAMs, such as prior art Test Sequences 1, 2, 3, and 4.

One concern is that the test sequences cannot be merged into each other with prior art methods in order to reduce the overall test set size lower than 16 patterns. This is caused by a conflicting setup between the A3-4 pins of Port 1 set by Pattern 1 in all four test sequences. For example, a scan load by Pattern 1 in Test Sequence 1 sets A3-4 pins of Port 1 to 1, while the scan load Pattern 1 in Test Sequence 2 sets A3 of Port 3 to 1 and its A4 to a 0, in Test Sequence 3 with A3 pin of Port 1 to 0 A4 pin to 1, and in Test Sequence 4 with the A3-4 pins of Port 1 to 0. Therefore, the four different setups of the A3-4 address pins of Port 1 cannot be achieved with a single scan load operation. Consequently, known test set compaction methods (reducing the size of a test data set) are unable to reduce the overall number of patterns to less than 16.

A second concern exists when test sequences such as Test Sequences 1, 2, 3, and 4 are applied when only a few selected read ports are set to read from predetermined written words in the RAM. For example, Test Sequence 1 sets Port 2 to read from a written word (A0-4=11111), leaving Ports 3, 4, and 5 read addresses unspecified and causing these ports to read from words which have not yet been written. Test Sequence 2 sets Port 3 to read from a written word (A0-4=11110), leaving Ports 2, 4, and 5 read addresses unspecified. The unused read ports produce unknown values at the outputs of these read ports when the test sequences are applied. These unknown values limit the efficiency of the test sequences, which is measured by the number of faults detected.

Related patents and publications to the present invention are:

U.S. Pat. No. 5,499,249 describes a method for automatic test generation for designs with embedded RAMs when they are surrounded, either partially or fully, by sequential design elements such as non-scan flip-flops, by using the functional models of the RAMs. The deterministic test patterns propagate fault effects in the upstream logic through the embedded RAMs to the observation points (either primary outputs or scan measure latches) and justify required signal values for testing faults in the downstream logic through the embedded RAMs. However, the patent does not guarantee that all outputs of multi-port embedded RAMs have specified values. When the method of this patent is applied, it generates test sequences equivalent to Test Sequences 1 to 5, with outputs of many read ports left in an unknown state prior to read-capture. Therefore, it does not overcome the problem of having unknown RAM output values when these test sequences are applied. Further, this method is not capable of exploring different structural configurations of embedded RAMs and making a deterministic test more efficient by ensuring all RAMs to have known output values. In summary, the aforementioned patent is not capable of solving the deterministic test pattern generation problem which leaves the embedded RAM (in multi-port configurations) output signals in an unknown state when deterministically-generated test sequences are applied.

U.S. Pat. No. 5,442,640 describes using randomly-generated patterns to test the logic (post-logic) fed by embedded arrays such as RAMs. Unless the entire space of RAMs is written when randomly-generated patterns are applied, many of the RAM outputs do not take a known value. This causes the RAM outputs feeding the post-logic circuits to unspecified values, limiting the effectiveness of the tests. This method requires long test cycles and is not able to test pre-logic circuits.

U.S. Pat. No. 5,331,643 to Smith et al. describes a method of having sections of the scan registers feeding the address pins of embedded arrays to be bypassed so that embedded arrays can be tested effectively with pseudo-random test data. The bypassed sections of the scan registers are connected to an address stepper mechanism which insures complete coverage throughout the range of the embedded array. The address stepper mechanism uses either a stepping counter or a linear feedback shift register or similar mechanism. This ensures that each cell address in the array is provided with known pseudo-random data at the beginning of a test. As with all random pattern tests, this method requires lengthy test cycles and lacks the ability to test faults on the address and read/write signals, compared to deterministic test generation methods.

A paper by L. C. Wang and M. S. Abadir, "Test Generation based on High Level Assertion Specification for PowerPC™ Microprocessor Embedded Arrays", Journal of Electronic Test: Theory and Application, Vol.13, No. 2, October. 1998, p121–35, Kluwer Academic Publishers. This paper describes a test generation method for embedded arrays using a technique called assertion, which is commonly used in formal verification. It applies the assertion technique with the functional model of embedded arrays to generate test. It does not show how the test generation works with embedded multi-port RAMs.

An article by M. E. Levitt, S. Nori, S. Narayanan, G. P. Grewal, L. Youngs, A. Jones, G. Billus, and S. Paramanandam, "Testability, debuggability, and manufacturability features of the UltraSPARC-I™ microprocessor", Proceedings of the International Test Conference, October 1995, IEEE.

An article by M. E. Levitt, "Designing UltraSparc™ for Testability", Design and Test of Computers, Vol. 14, No. 1, March 1997, IEEE.

An article by G. Billus and L. Youngs, "Test of the UltraSPARC-I Microprocessor Embedded Memories, TLBs, and Register Files", Texas Instruments Technical Journal, Vol. 13, No. 3, May–June 1996, pp. 101–110, Texas Instruments Inc The above three publications have a section on embedded-array testing, with little detailed information on how it is achieved. No explanation is given how a custom SRAM test mode is used to facilitate a required test, particularly, where 400 gates and 100 flip-flops are used in the implementation of the test mode. Further, these publications do not describe the generation of test sequences used for the SRAM test mode altogether.

SUMMARY OF THE INVENTION

The present invention describes a method of improving the efficiency of test sequences for testing circuits with a plurality of multi-port RAMs emedded in logic by ensuring that all the outputs of the embedded multi-port RAMs are set to known values when the enhanced test sequences are applied.

A first object of the present invention is to improve the efficiency of test sequences, the efficiency being measured by the total number of faults detected.

A second object of the invention is to generate a set of test sequences which is significantly smaller in size when it is compared to test sequences generated by conventional methods.

The above objects are attained by a method for improving the efficiency of test sequences for testing logic having a multiple port random access memory (RAM) embedded therein, the RAM having at least one read port and one write port, the read port having a plurality of output terminals and address input terminals and the write port having a plurality of data input terminals and address input terminals, the method comprising the steps of:

a) applying an initial test sequence to a plurality of inputs of the logic;

b) identifying which of the outputs of the at least one read port have an indeterminate value; and c) setting each of the outputs of the at least one read port having an indeterminate value to a known value by:

c1) forcing the address input terminals of the at least one read port to read a first word at a first address such that the first word read appears at the output terminals of the at least one read port; and in the event where step c1) fails to set the outputs of the at least one read port having an indeterminate value to a known value, performing step c2) by c2) writing a second word at a second address accessible to the at least one write port and forcing the read address terminal of the at least one read port to read the second word, wherein the second written word appears at the output terminals of the at least one read port.

BRIEF DESCRIPTION OF THE DRAWING

The accompanying drawings, which are incorporated, and which constitute a part of the specification, illustrate presently an embodiment of the invention and, together with the general description given above and a detailed description of the preferred embodiment given below, serve to explain the principles of the invention.

DETAILED DESCRIPTION OF A PREFERRED EMBODIMENT OF THE INVENTION

As previously stated, one object of the present invention is to improve the efficiency of test sequences for circuits having embedded multi-port RAMs such that when the improved test sequences are applied, all data outputs of these RAMs are at known values.

Figure 6:
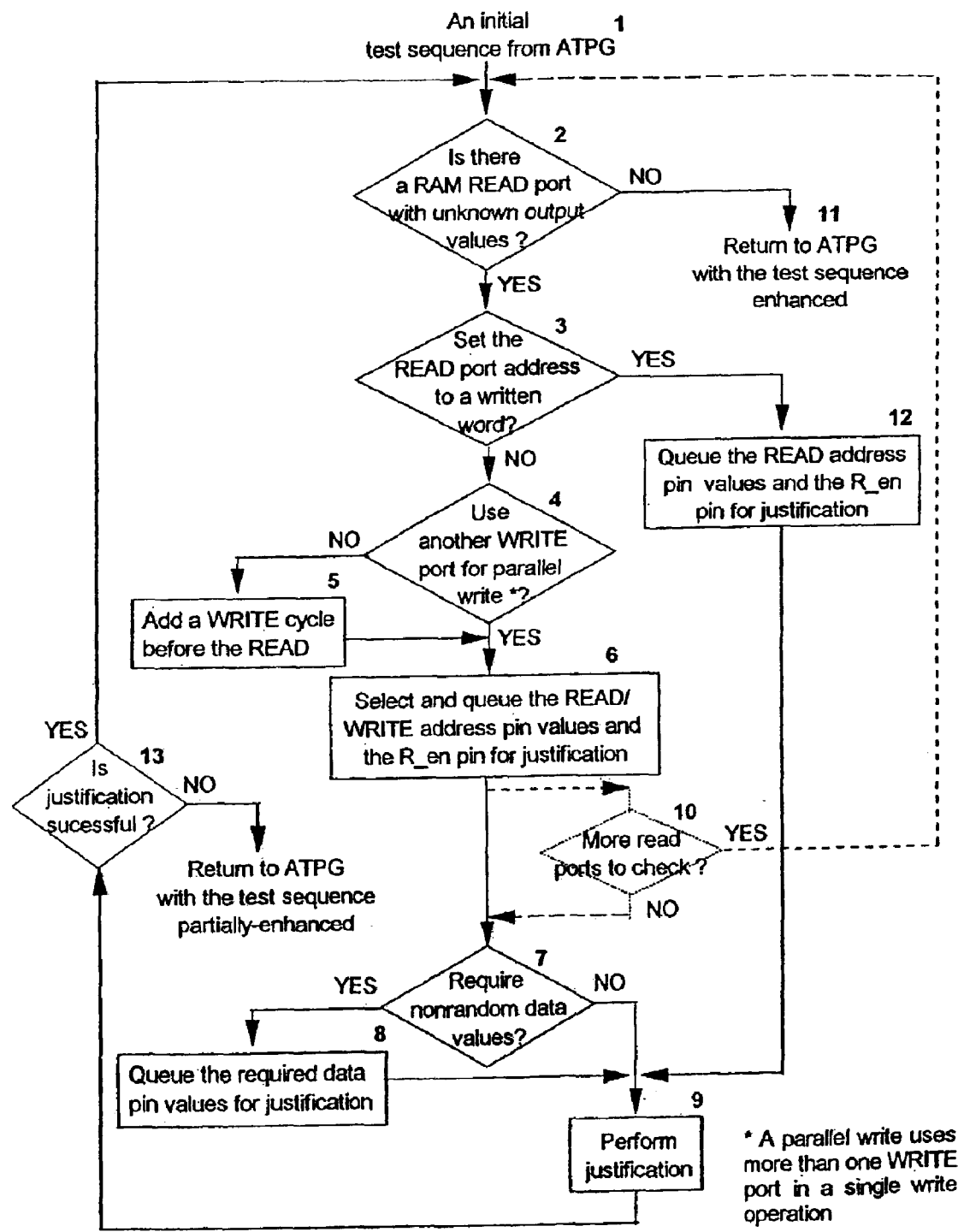
FIG. 6 shows a flow chart outlining the test sequence efficiency improvement method, in accordance with the invention.

Referring now to FIG. 6 showing the steps leading to the aforementioned improvement in accordance with the present invention, the process is initiated with a test sequence (Step 1), with read ports of embedded RAMs standing at an unknown output value (due to either unspecified or randomly-set read addresses). Step 2 checks that all the outputs of the RAM read ports are in a known state. Step 3 determines if it is possible to assign a read address, pointing to an already-written word, to the read port, currently at an unknown output value. If Step 3 returns a YES, then Step 12 forces the appropriate read address pin values into the justification queue for processing (Step 9) such that the required address pin assignments are justified through input pins and/or controllable scan latches. When Step 3 returns a NO, Step 4 determines if it is possible to apply a parallel write (if the initial test sequence performs at least one RAM write) to a different address for the read port-to read-from.

A parallel write operation writes multiple words with one write instruction (write clock). Further, if Step 4 returns a NO, Step 5 will add a write cycle, followed by Step 6 to force the write and read ports address pin assignments (pointing to the same word) for the proper write and read cycles into the justification queue. When Step 4 returns a YES, Step 6 then adds the necessary write and read address pin assignments for the current write cycle into the justification queue. Step 7 determines if non-random data bit values are required. If YES, appropriate values on the data pins of the write port are forced into the justification queue. Step 9 processes all the requirements in the justification queue so that they are justified by appropriate assignments on the input pins and/or the scan-controllable latches. Step 13 checks for the status of the justification process. If the justification process is not successful, the initial test sequence may be partially enhanced (if a subset of read ports are set to written words) or not at all (if none of the additional read ports is set to written words).

The above described flow processes a single read port at a time and justify the required assignments. By inserting Step 10 between Step 6 and Step 7, it allows the flow to force all write and read ports required assignments into the justification queue before the justification process (Step 9) starts. The change of flow does not alter the results, but it provides an alternative way for performing justifications, a common practice by known ATPG algorithms.

With the invention method, the above described prior art Test Sequence 1 is enhanced to ensure that all four read ports output pins are at known values before the Read-Capture cycle. Below is a step-by-step example that illustrates how test sequences, such as prior art Test Sequence 1 can be improved.

Figure 1:
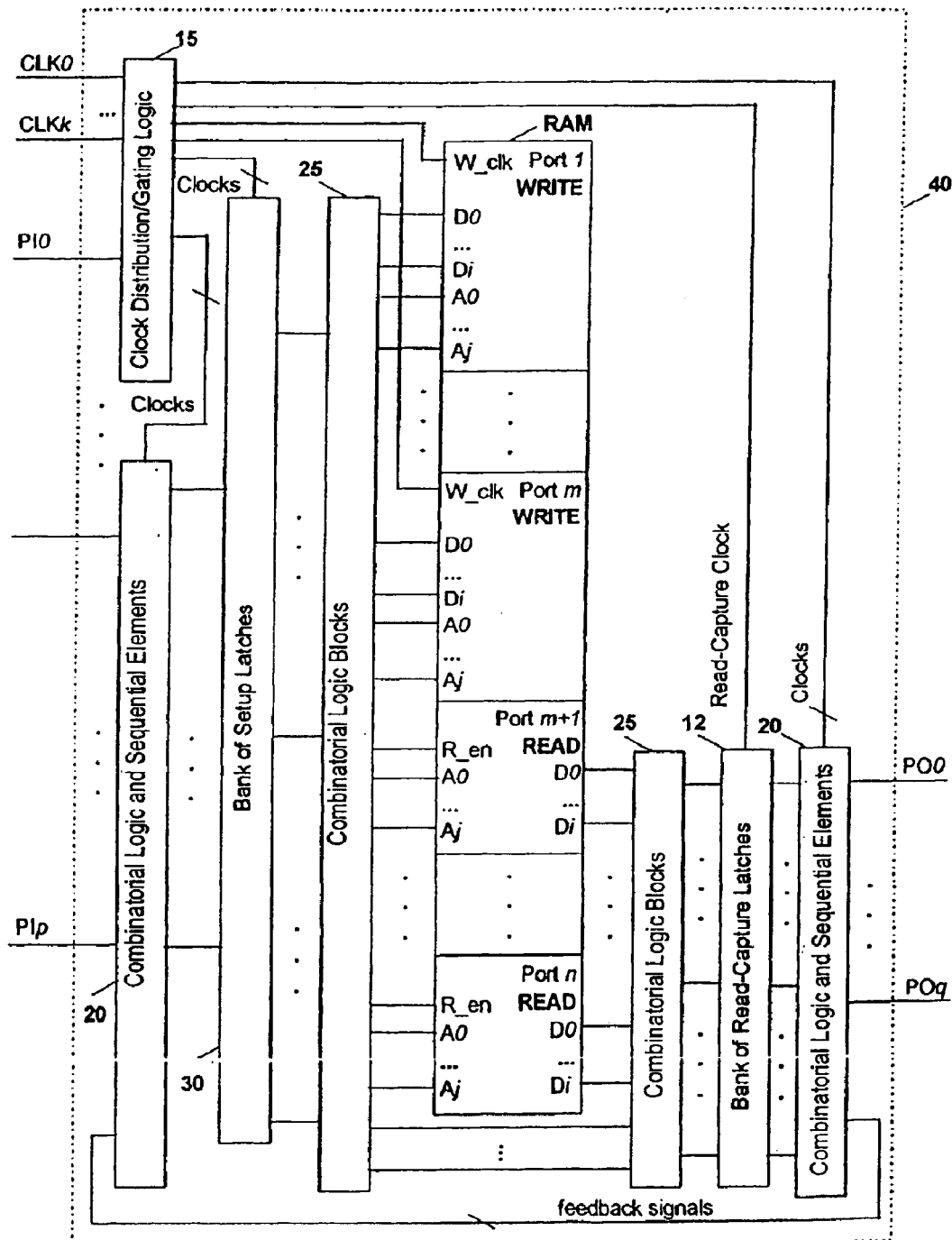
FIG. 1 is a schematic block diagram of a prior art of a multi-port RAM embedded in logic.
Figure 2:
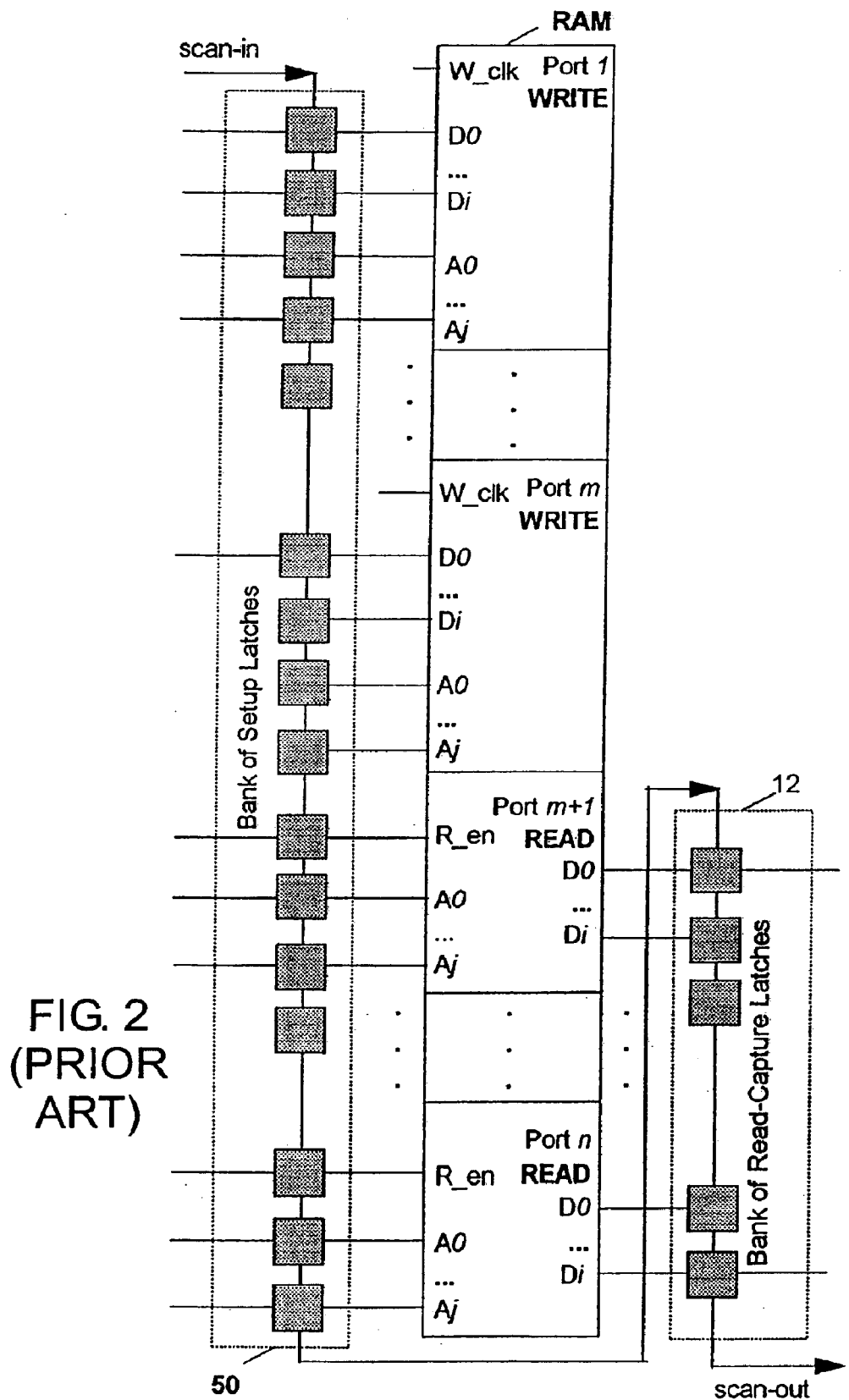
FIG. 2 shows the schematic block diagram of the prior art multi-port RAM of FIG. 1 configured with full-scan test methodology.
Figure 3:
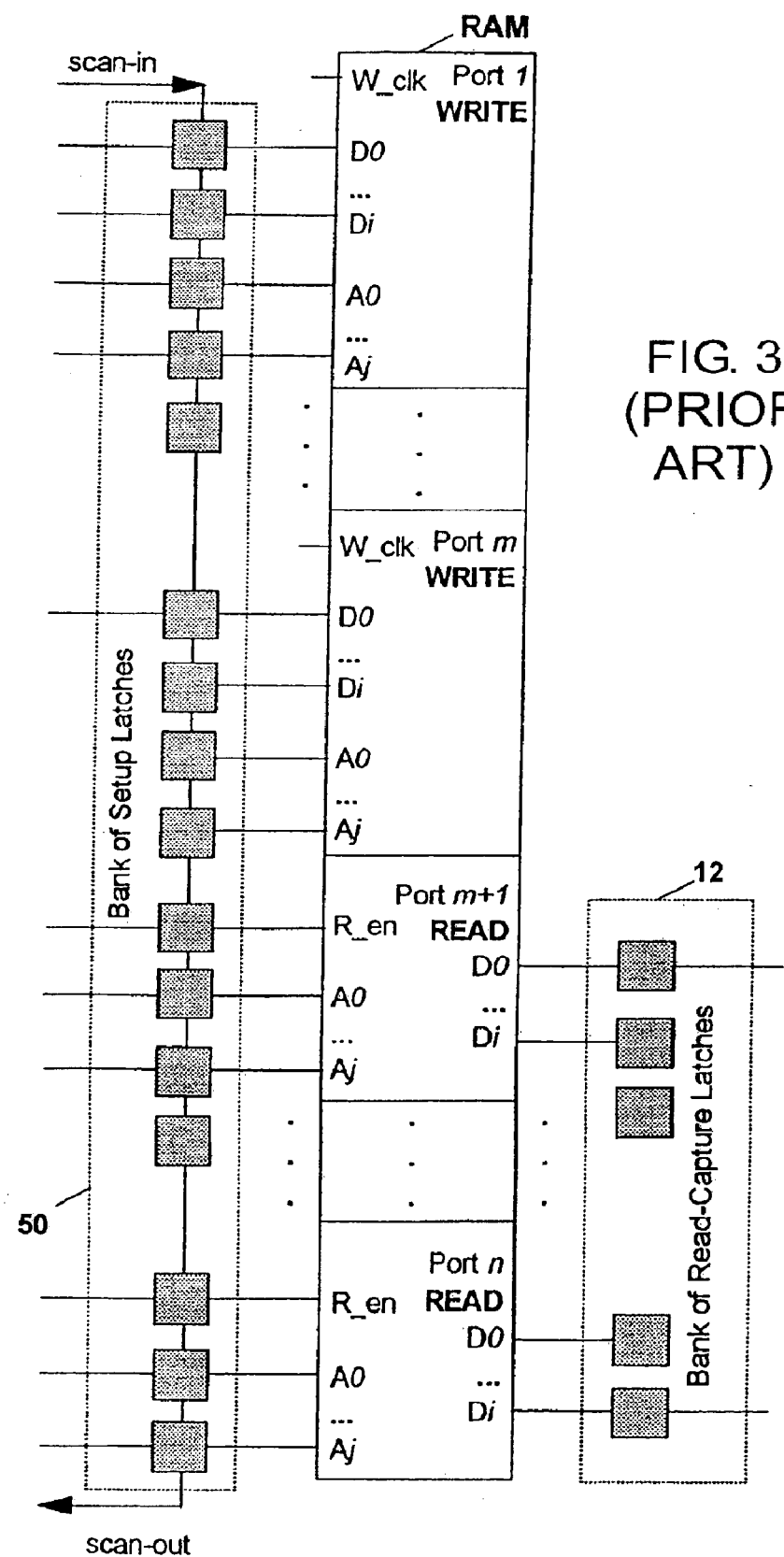
FIG. 3 shows the schematic block diagram of the prior art multi-port RAM of FIG. 1 configured with a partial-scan test methodology.
Figure 4:
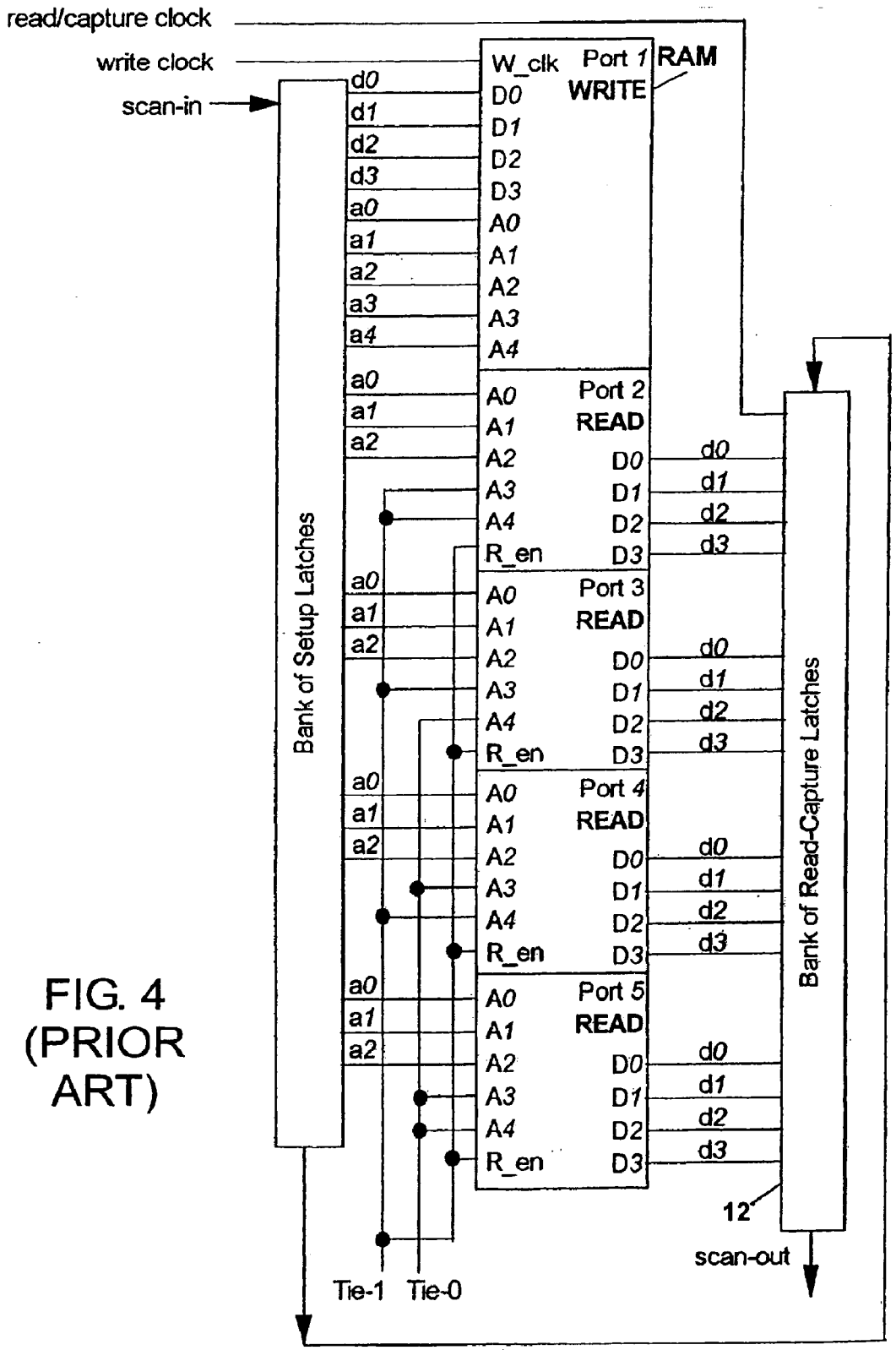
FIG. 4 is a schematic block diagram illustrating an example of generating test sequences.
Figure 5:
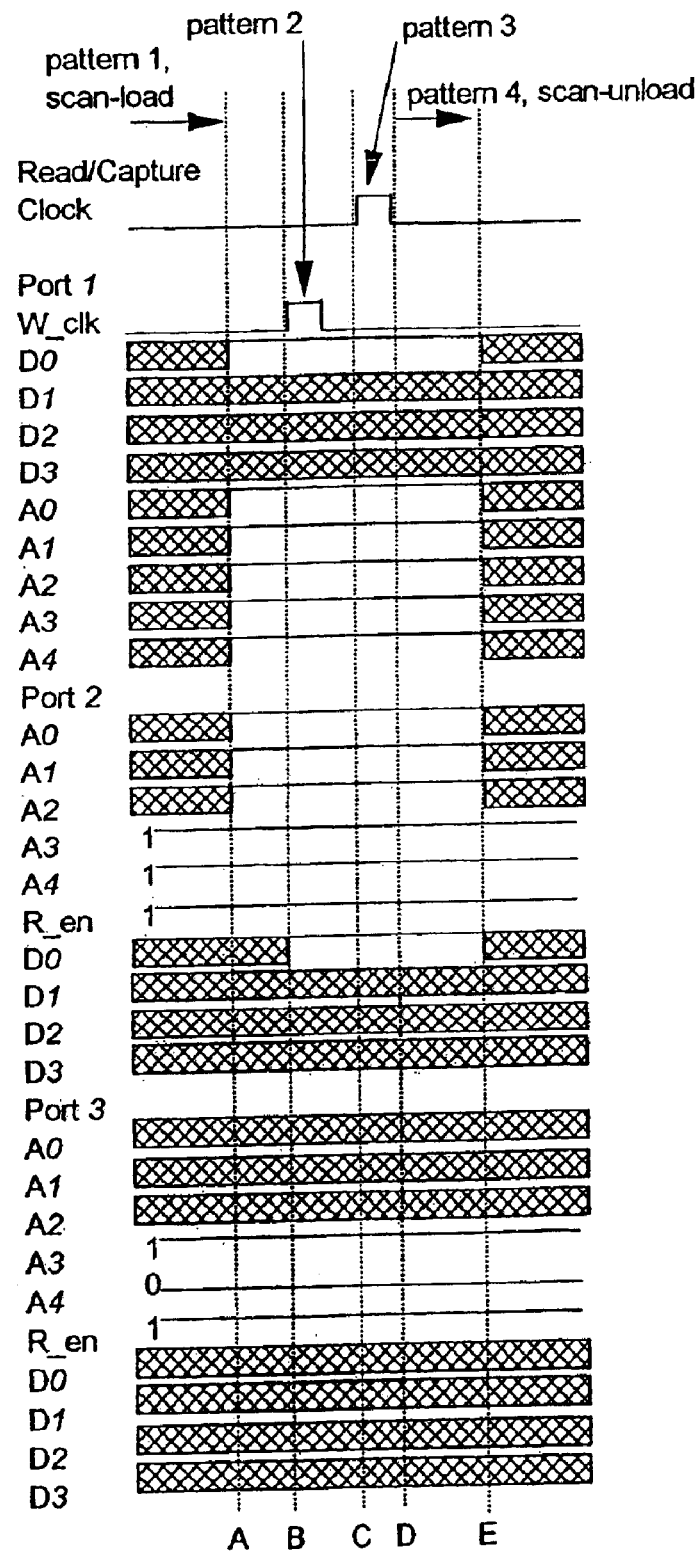
FIG. 5 shows conventional waveforms applicable to the test sequence shown in FIG. 4.

The process is initiated by generating Test Sequence 1 by way of a test pattern generator (Step 1). The circuit simulation status integral to the test generator is examined. Let it be assumed that Port 3 has no data set for read capture (Step 2). Then, its address pins need to be set to a written word (Step 3). Since there is no word written for the ports addressing space to be had, an arbitrary all-1 on the A0-2 pins is chosen. Furthermore, since it is impossible for a parallel WRITE to take place due to there being only one WRITE port available and the address being already assigned to a conflicting address (Step 4), an additional WRITE cycle is inserted (Step 5) before Pattern 1 in Test Sequence 1. (Note: this arrangement was selected for simplicity of the program. The added WRITE cycle can be placed anywhere before the READ operation). The required write address is forced into the justification queue (Step 6) to be justified with the added write cycle. The read address is forced into the justification queue (Step 6) to be justified for a parallel READ setup with Pattern 1 in Test Sequence 1, since the RAM is configured for parallel READ. Assuming there are no required values on the data bits for Port 3, then random values are used for the data bits by leaving them unspecified (Step 7). The required address pins are justified back (Step 9) to the Setup scan latches (as shown in FIG. 4) and the resulting interim test sequence takes the following form:

Pattern: (Type=Scan-Load)//part of the added write cycle.
Load the Setup latches such that A0-3 of Port 1 are at 1, and A4 is at 0
Pattern: (Type=Pulse Clock)//part of the added write cycle.
Apply a PULSE to the write clock
Pattern 1: (Type=Scan-Load)//added Port 3 address pins setup.
Load the Setup latches such that A0-4 and D0 of Port 1 are at 1, and A0-2 of Ports 2 and 3 are at 1.
Pattern 2: (Type=Pulse Clock)
Apply a PULSE to the write clock
Pattern 3: (Type=Pulse Clock)
Apply a PULSE to the read/capture clock
Pattern 4: (Scan-Unload)
Shift out the data captured in the Read-Capture latches The same process is repeated for Ports 4 and 5 and the resulting Enhanced Test Sequence 1 can be described as follows:

Enhanced Test Sequence 1:
Pattern 1: (Type=Scan-Load)
Load the Setup latches such that A0-2 of Port 1 are at 1, and A3-4 are at 0.
Pattern 2: (Type=Pulse Clock)
Apply a PULSE to the write clock
Pattern 3: (Type=Scan-Load)
Load the Setup latches such that A0-2 and A4 of Port 1 are at 1, and A3 is at 0.
Pattern 4: (Type=Pulse Clock)
Apply a PULSE to the write clock
Pattern 5: (Type=Scan-Load)
Load the Setup latches such that A0-3 of Port 1 are at 1, and A4 is at 0.
Pattern 6: (Type=Pulse Clock)
Apply a PULSE to the write clock
Pattern 7: (Type=Scan-Load)
Load the Setup latches such that A0-4 and D0 of Port 1, and A0-2 of Ports 2, 3, 4, 5 are at 1.
Pattern 8: (Type=Pulse Clock)
Apply a PULSE to the write clock
Pattern 9: (Type=Pulse Clock)
Apply a PULSE to the read/capture clock
Pattern 10: (Scan-Unload)
Shift out the data captured in the Read-Capture latches When Enhanced Test Sequence 1 is applied to the exemplary circuit of FIG. 4, Pattern 1 loads the setup scan latches setting Port 1 A0-2 address pins to 1 and A3-4 address pins to 0 (A0-4=11100). When Pattern 1 is applied, random values are applied to the remaining setup scan latches, setting random values at data input pins D0-3 of Port 1.

Pattern 2 applies a write clock pulse to pin W_clk of Port 1 such that the random values at data input pins D0-3 are written to the specified word (A0-4=11100).

Pattern 3 loads setup scan latches to set the A0-2 and A4 address pins of Port 1 to 1, and A3 to 0 (A0-4=11101). When Pattern 3 is applied, random values are applied to the remaining setup scan latches, setting random values at the data input pins D0-3 of Port 1.

Pattern 4 applies a write clock pulse to the pin W_clk of Port 1 such that the random values at the data input pins D0-3 of Port 1 are written to the specified word (A0-4=11101).

Pattern 5 loads setup scan latches such that A0-3 of Port 1 are set to 1, and A4 to a 0 (A0-4=11100), with random values applied to the remaining setup scan latches.

Pattern 6 applies a write clock pulse to pin W_clk of Port 1. After applying Pattern 6, random values are written to the specified word (A0-4=11110).

Pattern 7 loads setup scan latches such that the RAM write Port 1 A0-4, the D0 pins and the read Ports 2, 3, 4, and 5 of A0-2 address pins are set to 1.

Pattern 8 applies a write clock pulse to the pin W_clk of Port 1. After Pattern 8 is applied, a 1 is written into the D0 bit of the specified word (A0-4=11111), with random values set to the remaining data bits. Now a 1 stands at the output data pin D0 of Port 2, while the written random values appear at the other output data pins of the RAM. At this point, all the RAM data output pins are at known values.

Pattern 9 applies a clock pulse such that the RAM output data pin values are locked into the read-capture latches.

Pattern 10 performs a scan unload operation to shift the data in the scan latches out for observations.

Enhanced Test Sequence 1 is provided with two important new features. First, at the read-capture time immediately prior to applying Pattern 9, all the RAM data output pins retain known values, which can detect additional faults. Secondly, when compared to the test data set consisting of prior art Test Sequences 1, 2, 3, and 4 which uses an over-all 16 patterns to exercise all the data output pins of the RAM, Enhanced Test Sequence 1 uses 10 patterns to accomplish the same results. Smaller test data sets reduce the cost of testing.

Test sequences enhanced through the process shown in FIG. 6 retain the compressed features of the original test sequences (i.e., the test sequences before their being processed by the aforementioned process for enhancement purposes). To illustrate this result, a second test sequence of prior art is first generated to be referred hereinafter as Test Sequence 5. It detects a stuck-at-1 fault condition on the output pin D1 of Port 2 (as seen in the circuit shown in FIG. 4).

Test Sequence 5:
  Pattern 1: (Type=Scan-Load)
    Load Setup latches such that A0-4 of Port 1 are at 1, D1 at 0, and A0-2 of Port 2 at 1.
  Pattern 2: (Type=Pulse Clock)
    Apply a PULSE to the write clock
  Pattern 3: (Type=Pulse Clock)
    Apply a PULSE to the read/capture clock
  Pattern 4: (Scan-Unload)
    Shift out the data captured in the Read-Capture latches Referring to Test Sequence 5, Pattern 1 loads setup scan latches to set the A0-4 address pins of Port 1 to 1 (A0-4=11111), the data input pin D1 of Port 1 to 0 and the address pins A0-2 of Port 2

Pattern 2 applies a clock pulse to the write clock pin W_clk of Port 1. After applying Pattern 2, a 1 appears at data output pin D1 in the fault-free circuit, while the output pins of Ports 3, 4, and 5 are set to unknown values. Now the fault-effect 0/1 at the output pin D1 of Port 2 is ready to be captured in the scan latch.

Pattern 3 applies a clock pulse to lock the RAM output data into the read-capture scan latches.

Pattern 4 scans out the locked scan latch data, with the fault-effect in the scan-out data stream.

Test Sequence 5 can be merged with (or subsumed) into Test Sequence 1. The resulting merged test sequence takes the following form, with two Patterns 1 in both Test Sequences 1 and 5 combined into a single pattern:

Merged Test Sequences 1 and 5:
  Pattern 1: (Type=Scan-Load)
    Load the Setup latches such that A0-4 and D0 of Port 1 are at 1, D1 at 0, and A0-2 of Port 2 at 1.
  Pattern 2: (Type=Pulse Clock)
    Apply a PULSE to the write clock
  Pattern 3: (Type=Pulse Clock)
    Apply a PULSE to the read/capture clock
  Pattern 4: (Scan-Unload)
    Shift out the data captured in the Read-Capture latches Pattern 1 loads the setup scan latches. After being applied, the address pins A0-4 of Port 1 are set to 1 (A0-4=11111), its data pin D0 to 1 and D1 to 0, along with Port 2 address pins A0-2 set to 1.

Pattern 2 applies a clock pulse to the write clock pin (W_clk) of Port 1. After applying Pattern 2, a 1 and a 0 appear at the output data pins D0 and D1 of Port 2 in the fault-free circuit, respectively, with random values on the D2-3 pins and unknown values at the outputs of Ports 3, 4, and 5.

Pattern 3 applies a clock pulse to the read-capture scan latches. After applying Pattern 3, data on the RAM output pins is locked in the read-capture scan latches.

Pattern 4 shifts the latched data out, with fault-effects 1/0 (from D0 of Port 2) and 0/1 (from D1 of Port 2) in the shift out data stream for observation. This resulting merged test sequence illustrates the compaction feature that the prior art Test Sequence 1 can be merged with another prior art Test Sequence 5.

To illustrate that the process outlined in FIG. 6 retains the compressed features of the original prior art test sequences, Enhanced Test Sequence 1 and prior art Test Sequence 5 are merged. When merged (or subsumed), the resulting test sequence consists of Patterns 1 from Test Sequence 5 is merged into Pattern 7 of the Enhanced Test Sequence 1, as will be explained in more detail hereinafter.

Merged Test Sequence 5 and Enhanced Test Sequence 1:
  Pattern 1: (Type=Scan-Load)
    Load the Setup latches such that A0-2 of Port 1 are at 1, and A3-4 are at 0.
  Pattern 2: (Type=Pulse Clock)
    Apply a PULSE to the write clock
  Pattern 3: (Type=Scan-Load)
    Load the Setup latches such that A0-2 and A4 of Port 1 are at 1, and A3 is at 0.
  Pattern 4: (Type=Pulse Clock)
    Apply a PULSE to the write clock
  Pattern 5: (Type=Scan-Load)
    Load the Setup latches such that A0-3 of Port 1 are at 1 and A4 at 0.
  Pattern 6: (Type=Pulse Clock)
    Apply a PULSE to the write clock
  Pattern 7: (Type=Scan-Load)
    Load Setup latches such that A0-4 and D0 of Port 1 are at 1, D1 at 0, and A0-2 of Ports 2, 3, 4, 5 at 1.
  Pattern 8: (Type=Pulse Clock)
    Apply a PULSE to the write clock
  Pattern 9: (Type=Pulse Clock)
    Apply a PULSE to the read/capture clock
  Pattern 10: (Scan-Unload)
    Shift out the data captured in the Read-Capture latches With the above merged test sequence, there is shown that the compressed features of original Test Sequence 1 are retained in the Enhanced Test Sequence 1 after its being processed, as outlined in FIG. 6. Every pattern of this resulting merged test sequence is identical to the Enhanced Test Sequence 1, except that Pattern 7 now also sets the D1 data bit to 0 through Port 1, a direct result of their being merged with Pattern 1 of Test Sequence 5.

Finally, the inventive method illustrated in FIG. 6 makes it possible to process designs wherein logic blocks are positioned between the Setup scan latches and a RAM, and/or between a RAM and the Read-Capture latches, or when the Setup and/or Read-Capture latches are configured as non-scan latches. In such an instance, Step 9 (in the process outlined in FIG. 6) utilizes a prior-art deterministic ATPG justification process, and justifies required signal values through the logic blocks to the primary input pins and/or scan controllable latches.

Whereas the present invention has been described by way of the foregoing embodiment, it is needless to say that various changes and modifications can be made, e.g., in the steps described in the flow chart summarizing the main features of the invention or in the topology of the embedded RAM in logic without departing from the scope and the spirit of the subject matter of the present invention.

What is claimed is:

1. A program storage device readable by a machine, tangibly embodying a program of instructions executable by the machine to perform method claims for improving the efficiency of test sequences for testing an array of a plurality of random access memories (RAMs) embedded in logic, each of the RAMs having at least one read port and one write port, the read port having a plurality of output terminals and address input terminals and the write port having a plurality of data input terminals and address input terminals, the method steps comprising:

a) applying an initial test sequence to a plurality of inputs of the logic;
   b) identifying which of the outputs of the at least one read port of each of the RAMs has an indeterminate value; and
   c) setting each of the outputs of the at least one read port in each of the RAMs having an indeterminate value to a known value by:
      c1) forcing the address input terminals of the at least one read port to read a first word at a first address such that the first word read appears at the output terminals of the at least one read port; and in the event where step c1) fails to set the outputs of the at least one read port having an indeterminate value to a known value, performing step c2) by
      c2) writing a second word at a second address accessible to the at least one write port and forcing the read address terminal of the at least one read port to read the second word, wherein the second written word appears at the output terminals.

2. The device of claim 1, wherein the initial test sequence is generated by a deterministic test pattern generator.

3. The device of claim 1, wherein step c1) the written word is generated by a deterministic test pattern generator.

4. The device of claim 1, wherein step c1) the written word is randomly generated.

5. The device of claim 1, wherein each of the RAMs is provided with a write clock for controlling the at least one write port, and a read enable for controlling the at least one read port.

6. The device of claim 5, wherein each of the RAMs is provided with a write clock for controlling the at least one write port.

7. The device of claim 5, wherein each of the RAMs is provided with the read enable pin for controlling the at least one read port.

8. The device of claim 1, where in a second write port is used for parallel operation within a pulse of the write clock.

9. The device of claim 1, wherein the same write port performs a serial write operation with multiple pulses of the write clock.

* * * * *